(12) United States Patent
Nishimura

(10) Patent No.: US 7,217,993 B2
(45) Date of Patent: May 15, 2007

(54) STACKED-TYPE SEMICONDUCTOR DEVICE

(75) Inventor: Takao Nishimura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/867,722

(22) Filed: Jun. 16, 2004

(65) Prior Publication Data
US 2005/0006745 A1    Jan. 13, 2005

(30) Foreign Application Priority Data
Jun. 24, 2003    (JP) .............................. 2003-180200

(51) Int. Cl.
*H01L 23/02* (2006.01)
(52) U.S. Cl. .............................. 257/686; 257/E25.027; 257/685; 257/723; 257/777; 438/108; 438/109; 361/760
(58) Field of Classification Search ................ 257/686, 257/777, 723, 699, 728, 773, 775, E23.125, 257/E25.023, E25.021, E25.027, 685, 659; 438/108, 109; 361/760
See application file for complete search history.

(56) References Cited

U.S. PATENT DOCUMENTS

| | | | |
|---|---|---|---|
| 5,340,771 A * | 8/1994 | Rostoker ...................... 29/827 |
| 5,519,176 A * | 5/1996 | Goodman et al. .......... 174/255 |
| 5,783,870 A * | 7/1998 | Mostafazadeh et al. ..... 257/791 |
| 5,994,166 A | 11/1999 | Akram et al. |
| 6,188,127 B1 * | 2/2001 | Senba et al. ................ 257/686 |
| 6,274,929 B1 * | 8/2001 | Leong et al. ............... 257/724 |
| 6,335,669 B1 * | 1/2002 | Miyazaki et al. ........... 333/247 |
| 6,472,741 B1 * | 10/2002 | Chen et al. ................. 257/712 |
| 6,489,669 B2 * | 12/2002 | Shimada et al. ............ 257/686 |
| 6,493,229 B2 * | 12/2002 | Akram et al. ............... 361/704 |
| 6,608,379 B2 * | 8/2003 | Yeo et al. ................... 257/706 |
| 6,713,375 B2 * | 3/2004 | Shenoy ....................... 438/612 |
| 6,768,208 B2 * | 7/2004 | Lin et al. .................... 257/777 |
| 2003/0006494 A1 | 1/2003 | Lee et al. |

FOREIGN PATENT DOCUMENTS

| | | |
|---|---|---|
| JP | 2000-174204 | 6/2000 |
| JP | 2001-223297 | 8/2001 |
| KR | 2003-3539 | 1/2003 |

OTHER PUBLICATIONS

Korean Office Action dated Jan. 27, 2006 for a corresponding Korean application No. 10-2004-0046997.

* cited by examiner

*Primary Examiner*—Kenneth Parker
*Assistant Examiner*—Chris C. Chu
(74) *Attorney, Agent, or Firm*—Westerman, Hattori, Daniels & Adrian, LLP.

(57) ABSTRACT

A stacked-type semiconductor device includes a first wiring substrate on which a semiconductor device element is mounted, a second wiring substrate stacked on the first wiring substrate through a plurality of electrode terminals which are electrically connected with the first wiring substrate, and a conductor supporting member disposed around the semiconductor device element, and connected with grounding wiring layers provided in the first and second wiring substrate.

7 Claims, 8 Drawing Sheets

STACKED-TYPE SEMICONDUCTOR DEVICE

BACKGROUND OF THE INVENTION

1. Field of the Invention

The present invention relates to a semiconductor device, and, in particular, to a stacked-type semiconductor device having a three-dimensional structure in which a plurality of semiconductor devices and semiconductor device elements are stacked with each other.

2. Description of the Related Art

Along with recent development of electronic devices, a demand for a semiconductor devices used in the electronic devices to be miniaturized, reduced in thickness, to have various functions, to have enhanced functions, to have an increased density, has been increasing.

In order to satisfy such a demand, a structure of a semiconductor package comes to be changed to a stacked-type semiconductor device having a three-dimensional structure in which a plurality of semiconductor devices or a plurality of semiconductor device elements are stacked with each other. For example, Japanese Laid-open Patent Application No. 2001-223297 discloses a relevant art, in particular, in page 8 and FIG. 15 thereof.

Also along with recent development of electronic devices, influence of unnecessary electric waves such that a possibility that one electronic device malfunctions due to unnecessary electric waves generated by another electronic device may not actually be ignored in many cases. Therefore, electronic devices which satisfy the EMS (electromagnetic interference rule, which regulates radiation or propagation of electromagnetic noise (electric waves) for the purpose of eliminating influence of one electronic device on anther electronic device) come to be demanded.

In the stacked-type semiconductor device in which a plurality of semiconductor devices and semiconductor device elements are stacked with each other, in a case where a radio-frequency circuit device such as a radio-frequency analog signal processing semiconductor device is mounted in a mixed loading manner therein, it is necessary to control electromagnetic radiation (unnecessary radiation/radiating electromagnetic noise/electric wave noise) generated therefrom, to a level lowest possible.

Japanese Laid-open Patent Application No. 2000-174204, especially, in pages 3–5 and FIG. 2 thereof, discloses one example of a stacked-type semiconductor device in the related art designed to solve such a problem of electromagnetic radiation. The specific configuration thereof is described next with reference to FIG. 9. In a stacked-type semiconductor device shown in FIG. 9, a radio-frequency circuit device 3 is mounted in a cavity part 2, also, a ground conductor is provided on a rear side of a first dielectric substrate 1 formed on a metal base 8, and a second dielectric substrate 5 having a radio-frequency circuit device 4 mounted thereon is stacked. Further, a metal cover 6 is provided for covering the second dielectric substrate 5 on the first dielectric substrate 1, an end of the metal cover is connected to via holes 7 provided in the first dielectric substrate 1, and the metal cover 6 is connected with the first dielectric substrate 1 with the use of conductive adhesive or such. The metal cover 6 electromagnetically shields the radio-frequency circuit device 4, and also, it seals the radio-frequency circuit device 4 and the radio-frequency circuit device 3 in an airtight manner.

SUMMARY OF THE INVENTION

In Japanese Laid-open Patent Application No. 2001-223297 mentioned above, there is no specific disclosure concerning an electromagnetic shield prepared for the stacked-type semiconductor device for conforming to the above-mentioned EMI regulation. Further, although there is a disclosure of considering the EMI regulation for the stacked-type semiconductor device in Japanese Laid-open Patent Application No. 2000-174204 also mentioned above, the first substrate has a shape of a cavity as mentioned above, and also, the airtight sealing is provided, whereby such a configuration may not be advantageous in terms of saving the production costs. Furthermore, since this configuration has the metal cover as mentioned above, it may be difficult to effectively reduce the thickness of the device as a whole. Therefore, it is then demanded to provide a stacked-type semiconductor device having a radio-frequency circuit device mounted therein in a mixed loading manner, electromagnetic radiation therefrom being able to be reduced to a lowest possible level, and also, requiring reduced production costs and effectively miniaturized as a whole.

In order to satisfy this demand, according to one aspect of the present invention, a stacked-type semiconductor device includes a first wiring substrate on which a semiconductor device element is mounted, a second wiring substrate stacked on the first wiring substrate through a plurality of electrode terminals which are electrically connected with the first wiring substrate and a conductor supporting member disposed around the semiconductor device element and connected with grounding wiring layers provided in the first and second wiring substrates.

According to the present invention, by providing such a configuration, it is possible to provide a stacked-type semiconductor device in which a level of electromagnetic radiation generated from a radio-frequency circuit device mounted therein in a mixed loading manner can be well controlled, and also, which can be produced in a reduced thickness (miniaturized) with reduced costs, in comparison to a configuration in the related art. Furthermore, according to the present invention, since the wiring substrates are connected together not only with the electrode terminals which connect these wiring substrates together but also with the conductor supporting member, manufacturing defects in electrode terminal connection portions due to bending of the wiring substrates or such can be effectively reduced, and thus, it is possible to provide a stacked-type semiconductor device improved in the connection reliability between the wiring substrates thereof.

BRIEF DESCRIPTION OF THE DRAWINGS

Other objects and further features of the present invention will become more apparent from the following detailed description when read in conjunction with the accompanying drawings.

DETAILED DESCRIPTION OF THE PREFERRED EMBODIMENTS

Figure 1:
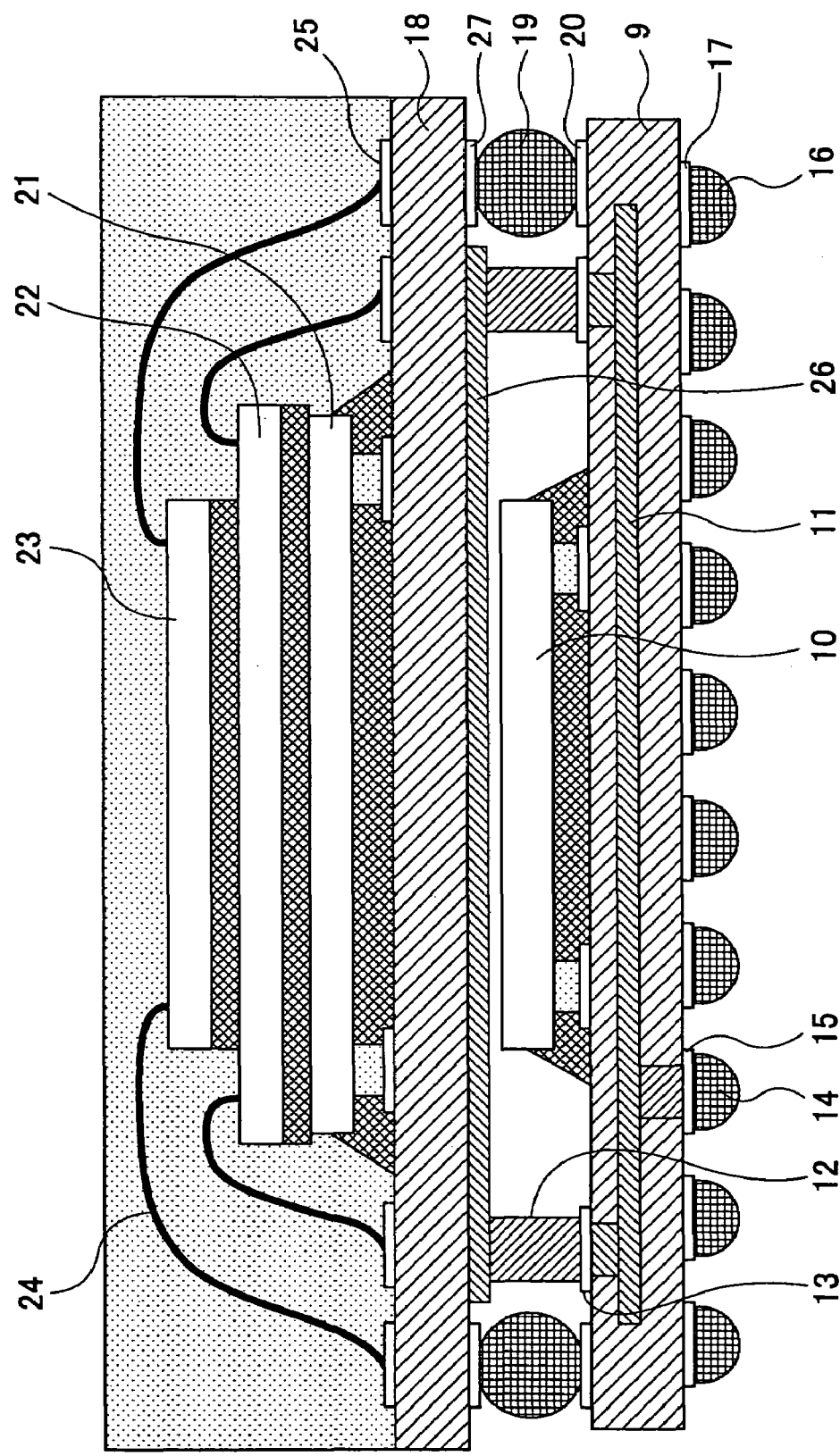
FIG. 1 shows a side elevational sectional view of a stacked-type semiconductor device in a first embodiment of the present invention.
Figure 2:
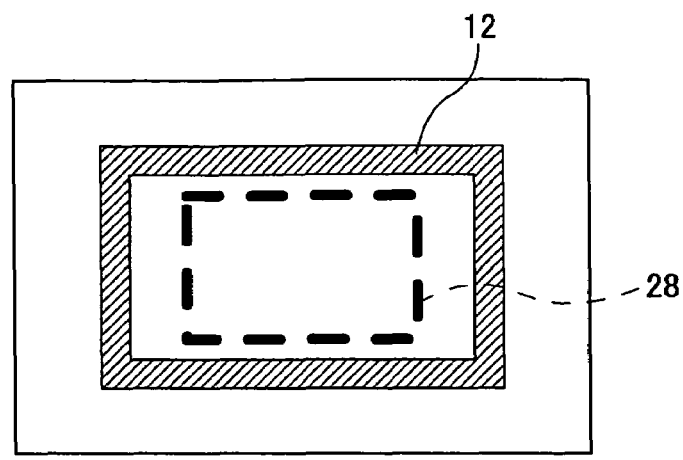
FIG. 2 shows a plan view illustrating a structure of a conductor supporting member in the stacked-type semiconductor device shown in FIG. 1.
Figure 3A:
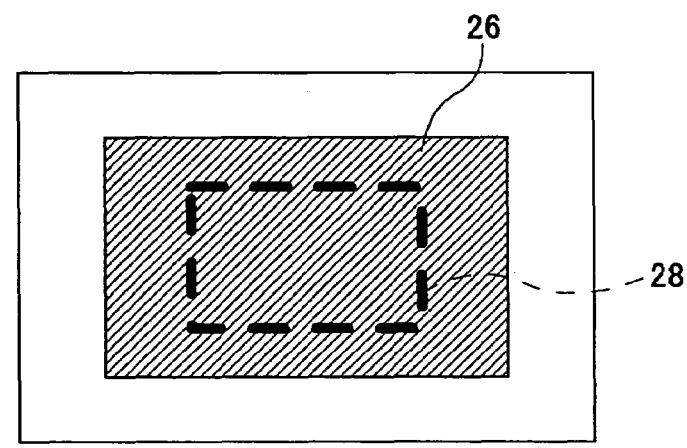
FIGS. 3A and 3B show plan views illustrating alternative examples of a pattern of grounding wiring layer provided in the stacked-type semiconductor device shown in FIG. 1.
Figure 3B:
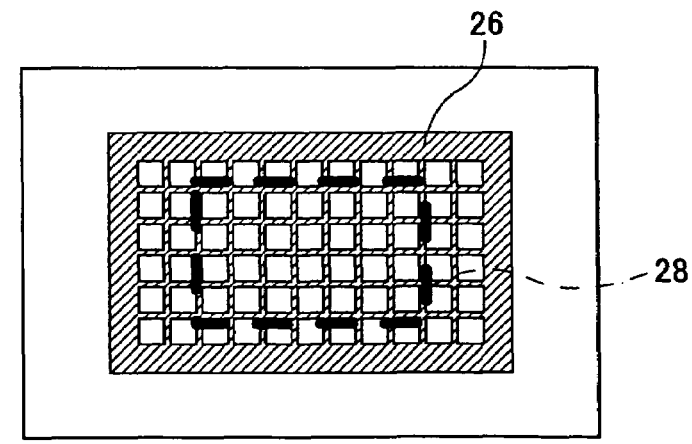

FIG. 1 shows a side elevational sectional view of a stacked-type semiconductor device in a first embodiment of the present invention; FIG. 2 shows a plan view illustrating a structure of a conductor supporting member 12 in the stacked-type semiconductor device shown in FIG. 1; and FIGS. 3A and 3B show plan view respectively illustrating alternative examples of a pattern of a ground wiring layer 26 in the stacked-type semiconductor device shown in FIG. 1. As shown in the figures, the stacked-type semiconductor device includes wiring substrates 9 and 18; ground wiring layers 11 and 26; the conductor supporting member 12; connecting pads 13, 15, 17, 20, 25 and 27; semiconductor device elements 10, 21, 22 and 23; and wires 24.

In the stacked-type semiconductor device in the first embodiment of the present invention, the wiring substrate 9 is made of a material such as a glass epoxy resin, ceramics or such; the semiconductor device element 10 is mounted on the top side of the wiring substrate 9 in a flip-chip manner; and the semiconductor device element 10 is bonded onto the top side of the wiring substrate 9 by means of insulating resin such as epoxy resin. The semiconductor device element 10 is, for example, a radio-frequency circuit device such as an RF analog signal processing semiconductor device. The ground wiring layer 11 is embedded inside of the wiring substrate 9, and the ground wiring layer 11 is connected with the connecting pads 13 for connecting with the conductor supporting member 12 and connecting pads 15 for connecting with ground terminals 14, as shown in FIG. 1. The connecting pads 13 are formed and disposed like a frame shape around the semiconductor device element 10 mounted on the wiring substrate 9. External electrode terminals 16 provided for the purpose of connecting with an external circuit are formed in a form of solder balls on the connecting pads 17. In the periphery of the wiring substrate 9, the many connecting pads 20 are disposed for the purpose of electrically connecting the wiring substrates 9 and 18 together through solder balls 19 acting as electrode terminals.

On the other hand, the wiring substrate 18 is a multi-layer wiring substrate made of a material such as glass epoxy resin, ceramics or such. On the top side of the wiring substrate 18, the semiconductor device element 21 is mounted in a flip-chip manner, and the semiconductor device element 21 is bounded onto the top side of the wiring substrate 18 by means of insulating resin such as epoxy resin. Further, the semiconductor device element 22 is bounded onto the top of the semiconductor device element 21 by means of adhesive, and also, the semiconductor device element 23 is bounded onto the top of the semiconductor device element 22 by means of adhesive. Circuit connection between the semiconductor device elements 22 and 23 and the wiring substrate 18 is performed by gold wires 24 by wire boding with the use of the connecting pads 25 provided on the wiring substrate 18, as shown in FIG. 1. The entirety of the semiconductor device elements 21, 22 and 23 on the wiring substrate 18 are sealed by resin such as epoxy resin.

As shown in FIG. 3A or 3B, the ground wiring layer 26 made of metal such as copper (Cu), nickel (Ni), molybdenum (Mo), manganese (Mn) or such is provided on the bottom side of the wiring substrate 18. This ground wiring layer 26 is formed in a plating manner, a laminating manner, a printing manner, an evaporating manner or such. FIG. 3A shows an example in which the ground wiring layer 26 is formed in a form of a solid pattern while FIG. 3B shows another example in which the ground wiring layer 26 is produced in a form of a mesh pattern. There is a possibility that the wiring substrate 18 bends due to difference in conductor wiring density between the top and bottom sides of the wiring substrate 18. In this term, there is a case where it is advantageous to rather apply the mesh pattern shown in FIG. 3B in design. Furthermore, the many connecting pads 27 are disposed in the periphery of the wiring substrate 18 on the bottom side thereof for the purpose of electrically connecting the wiring substrate 18 and the wiring substrate 9 together by means of the solder balls 19. In each of FIGS. 2, 3A and 3B, a zone defined by a thick broken line 28 represents an area for mounting the semiconductor device element 10 on the wiring substrate 9.

The conductor supporting member 12 is produced from a sheet made of metal such as aluminum (Al), copper, nickel, titan (Ti), cobalt (Co), tungsten (W), iron (Fe) or such, or alloy of these types of metal, into a form of a frame as shown in FIG. 2, in a punching manner or an etching manner. The frame-like conductor supporting member 12 is bonded both with the connecting pads 13 provided on the top side of the wiring substrate 9 and with the ground wiring layer 26 provide on the bottom side of the wiring substrate 18 by means of conductive adhesive. Simultaneously, the solder balls 19 are used to connect the connecting pads 20 of the wiring substrate 9 and the connecting pads 27 provided on the bottom side of the wiring substrate 18 together.

In the above-described configuration of the stacked-type semiconductor device according to the first embodiment of the present invention, since the top side, the bottom side and the lateral sides of the semiconductor device element 10 is enclosed by the conductors (ground wiring layers 11 and 26, as well as the conductor supporting member 12) in the ground potential, unnecessary radiation generated from the semiconductor device element 10 is effectively blocked, and thus, it is possible to effectively reduce adverse influence thereof on other devices. Further, since the conductor supporting member 12 firmly supports the wiring substrate 9 and the wiring substrate 18, and thus the distance therebetween is kept unchanged, it is possible to effectively reduce a possibility of bending of these wiring substrates 9 and 18, and thus, to effectively reduce a possibility of fabrication defects in connection with the solder balls 19 otherwise occurring due to the bending of the substrates during a fabrication process of the stacked-type semiconductor device. Furthermore, since both the wiring substrates 9 and 18 are connected and fixed together by means of the frame-shaped conductor supporting member 12, connection reliability between both the wiring substrates 9 and 18 is improved. Thus, it is possible to achieve the stacked-type semiconductor device with a reduced thickness (miniaturized) having a configuration such that unnecessary radiation from the semiconductor device element mounted on the wiring substrate may be effectively blocked. It is noted that a manner of mounting the semiconductor device element 10 to the wiring substrate 9 is not limited to the above-mentioned flip-chip manner but another manner, such as a TAB (tape automated bonding) manner, for example, may be applied instead.

Figure 4:
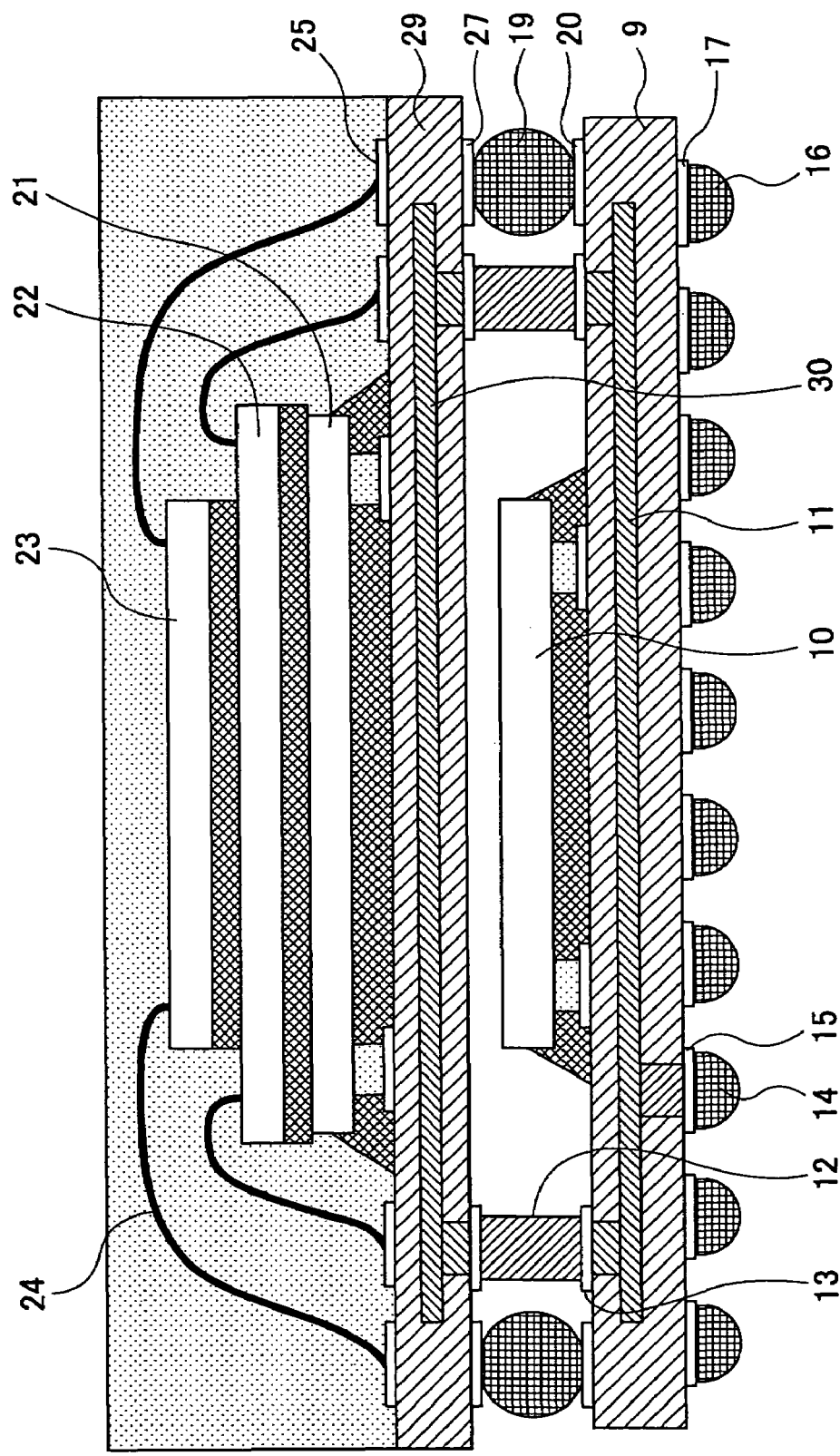
FIG. 4 shows a side elevational sectional view of a stacked-type semiconductor device in a second embodiment of the present invention.

FIG. 4 shows a side elevational sectional view of a stacked-type semiconductor device in a second embodiment of the present invention.

The second embodiment is different from the above-described first embodiment in that a ground wiring layer 30 in a top-side wiring substrate 29 is embedded inside of the wiring substrate 29. Other than this point, the second embodiment is same as the first embodiment in configuration. Accordingly, the stacked-type semiconductor device according to the second embodiment provides advantages same as those provided by the stacked-type semiconductor device according to the first embodiment. Furthermore, in the stacked-type semiconductor device according to the second embodiment, since the ground wiring layer 30 is embedded inside of the wiring substrate 29, it is possible to position the ground wiring layer 30 closer to the semiconductor device elements 21, 22 and 23 which are mounted on the top side of the wiring substrate 29 accordingly. Thereby, it is possible to improve high-speed signal transmitting performance of the electric circuits formed by these semiconductor device elements 21 through 23.

Figure 5:
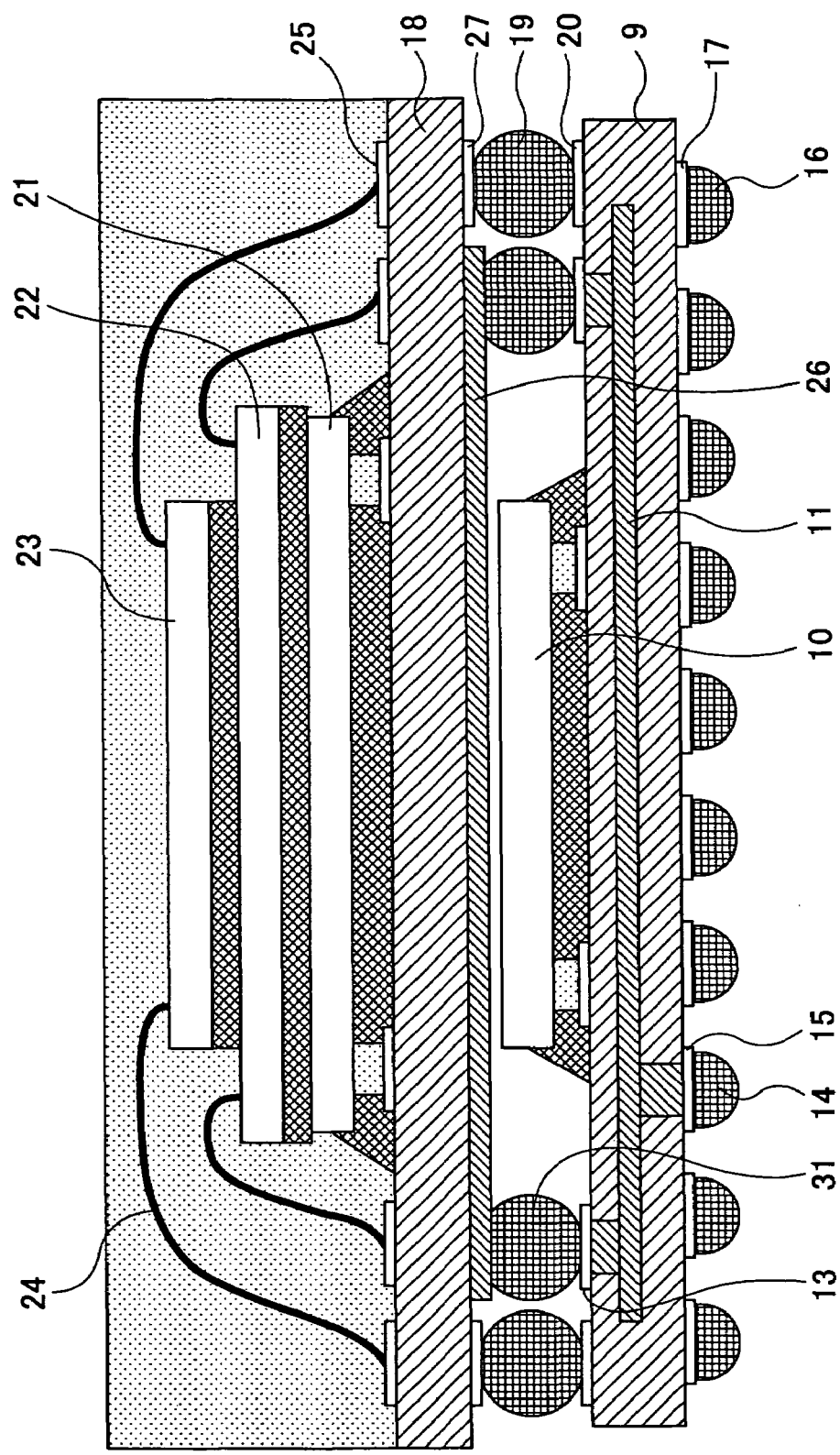
FIG. 5 shows a side elevational sectional view of a stacked-type semiconductor device in a third embodiment of the present invention.
Figure 6:
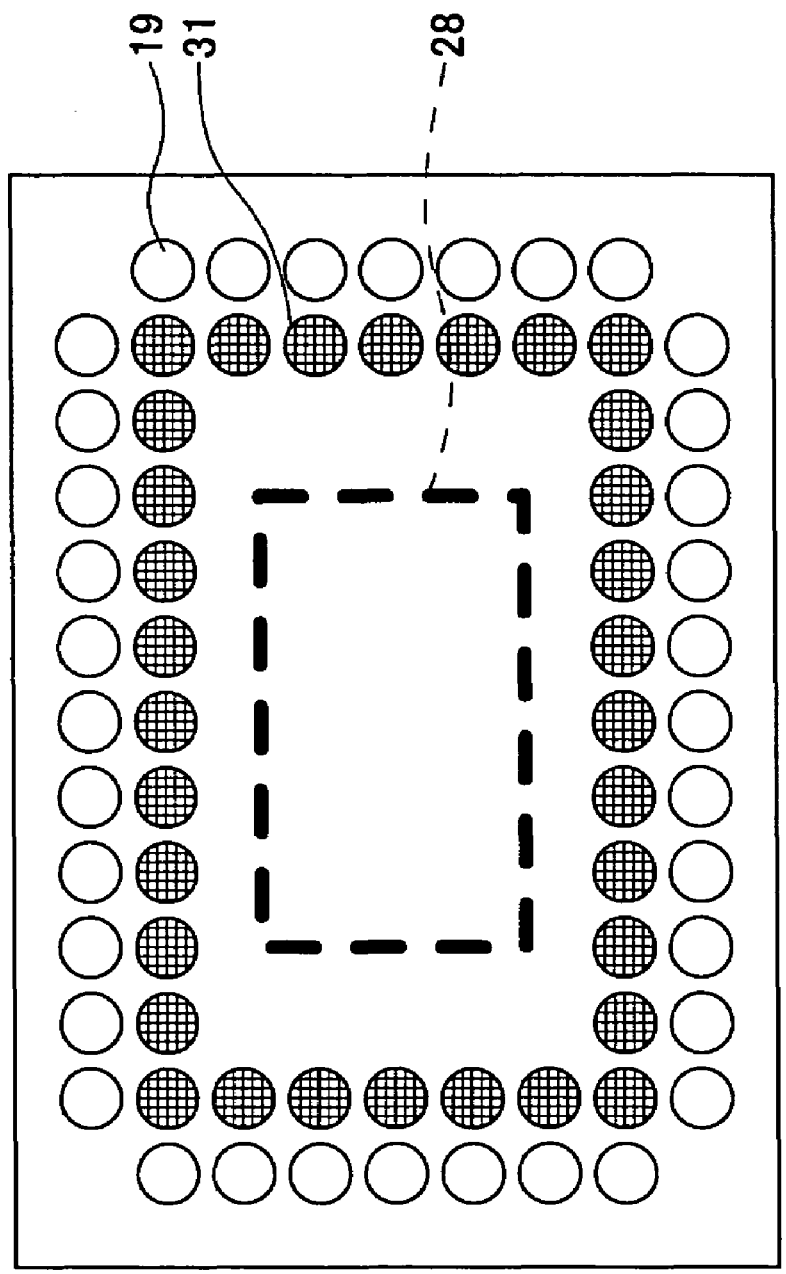
FIG. 6 shows a plan view illustrating a structure of a conductor supporting member in the stacked-type semiconductor device shown in FIG. 5.

FIG. 5 shows a side elevational sectional view of a stacked-type semiconductor device in a third embodiment of the present invention, and FIG. 6 shows a plan view illustrating arrangement of conductor supporting members 31 in the configuration shown in FIG. 5. The third embodiment is different from the above-described first embodiment in that solder balls are used as the conductor supporting members 31. The solder balls used as the conductor supporting members 31 are disposed inside of the solder balls 19 used as the electrode terminals electrically connecting the wiring substrates 9 and 18 together, and also, in the periphery of the semiconductor device element 10 (defined by a broken line 28 the same as for FIGS. 2, 3A and 3B). According to the third embodiment, since common solder balls are used as the conductor supporting members 31, it is possible to effectively reduce the costs required for providing the conductor supporting members in comparison to the first or second embodiment in which the frame-shaped conductor supporting member is provided.

Figure 7:
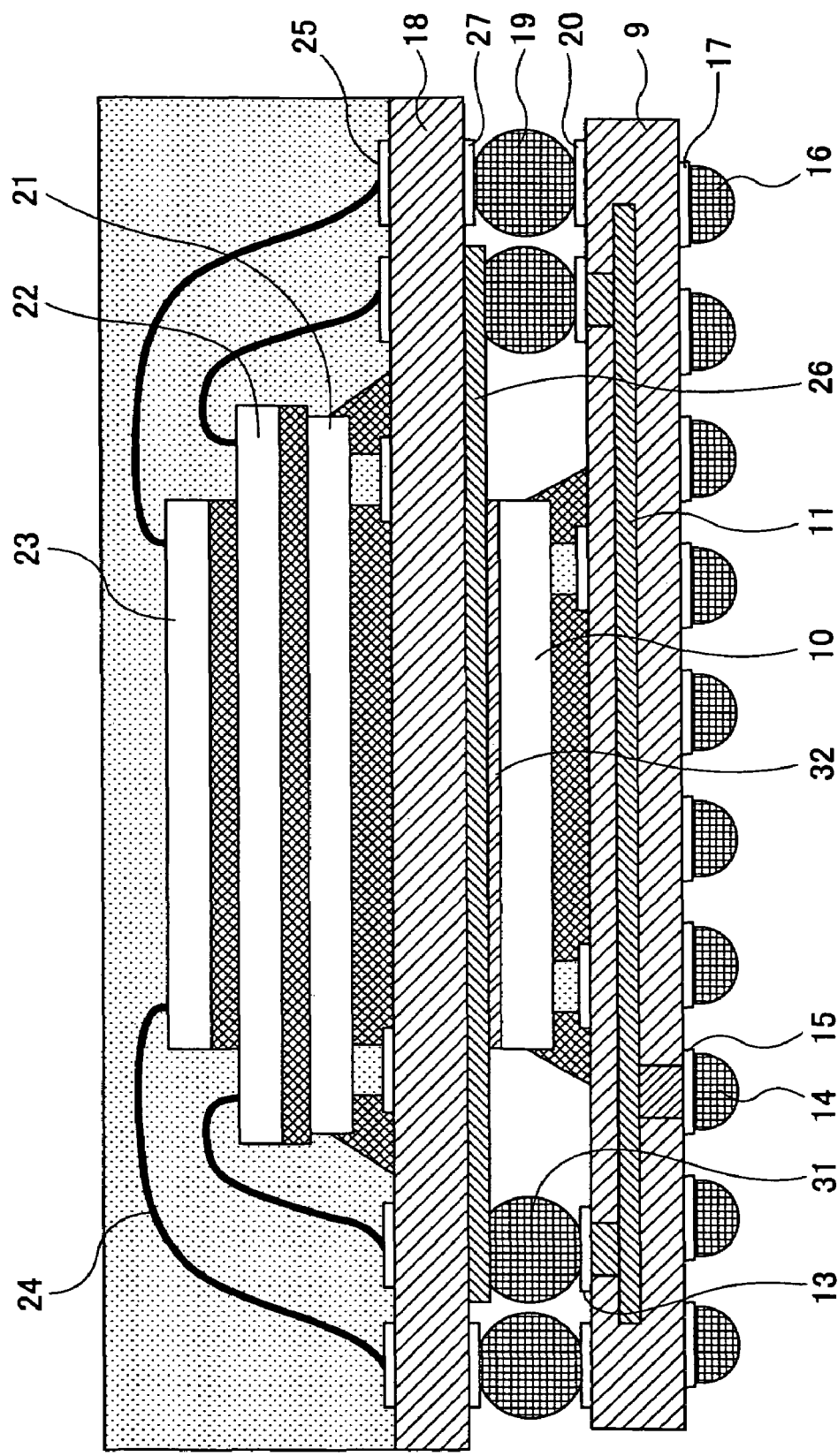
FIG. 7 shows a side elevational sectional view of a stacked-type semiconductor device in a fourth embodiment of the present invention.

FIG. 7 shows a side elevational sectional view of a stacked-type semiconductor device in a fourth embodiment of the present invention.

In the fourth embodiment, high-heat-conductive adhesive 32 such as resin adhesive including silver powder, for example, is filled with between the top side of the semiconductor device element 10 mounted on the wiring substrate 9 and the ground wiring layer 26 formed on the bottom side of the wiring substrate 18 in the above-described third embodiment. In the stacked-type semiconductor device according to the fourth embodiment, a path is created by the high-heat-conductive adhesive 32 for transmitting heat generated from the top surface of the semiconductor device element 10 through the ground wiring layer 26 and the solder balls used as the conductor supporting members 31. Thereby it is possible to improve the heat radiation performance of the semiconductor device element 10.

Figure 8:
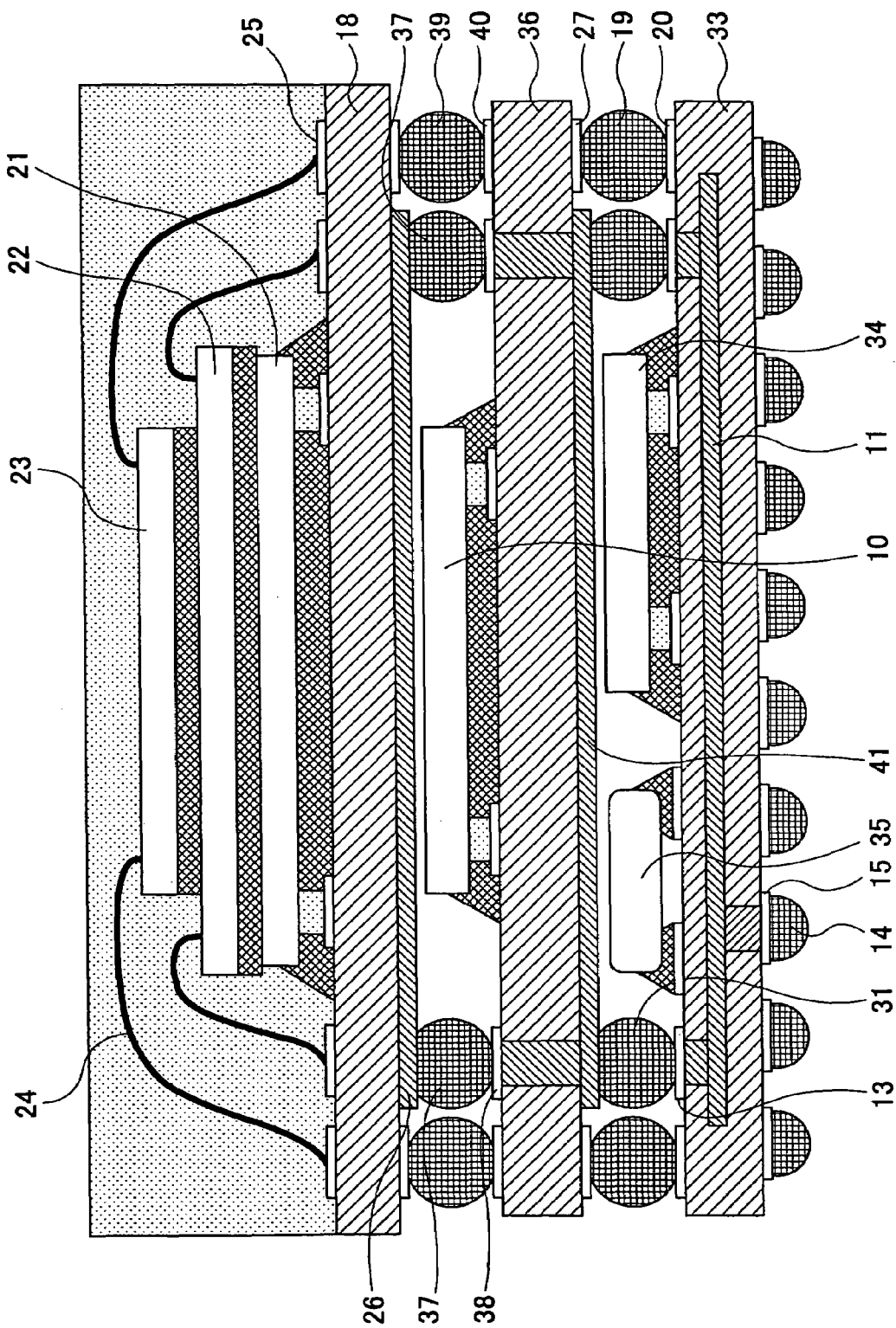
FIG. 8 shows a side elevational sectional view of a stacked-type semiconductor device in a fifth embodiment of the present invention.
Figure 9:
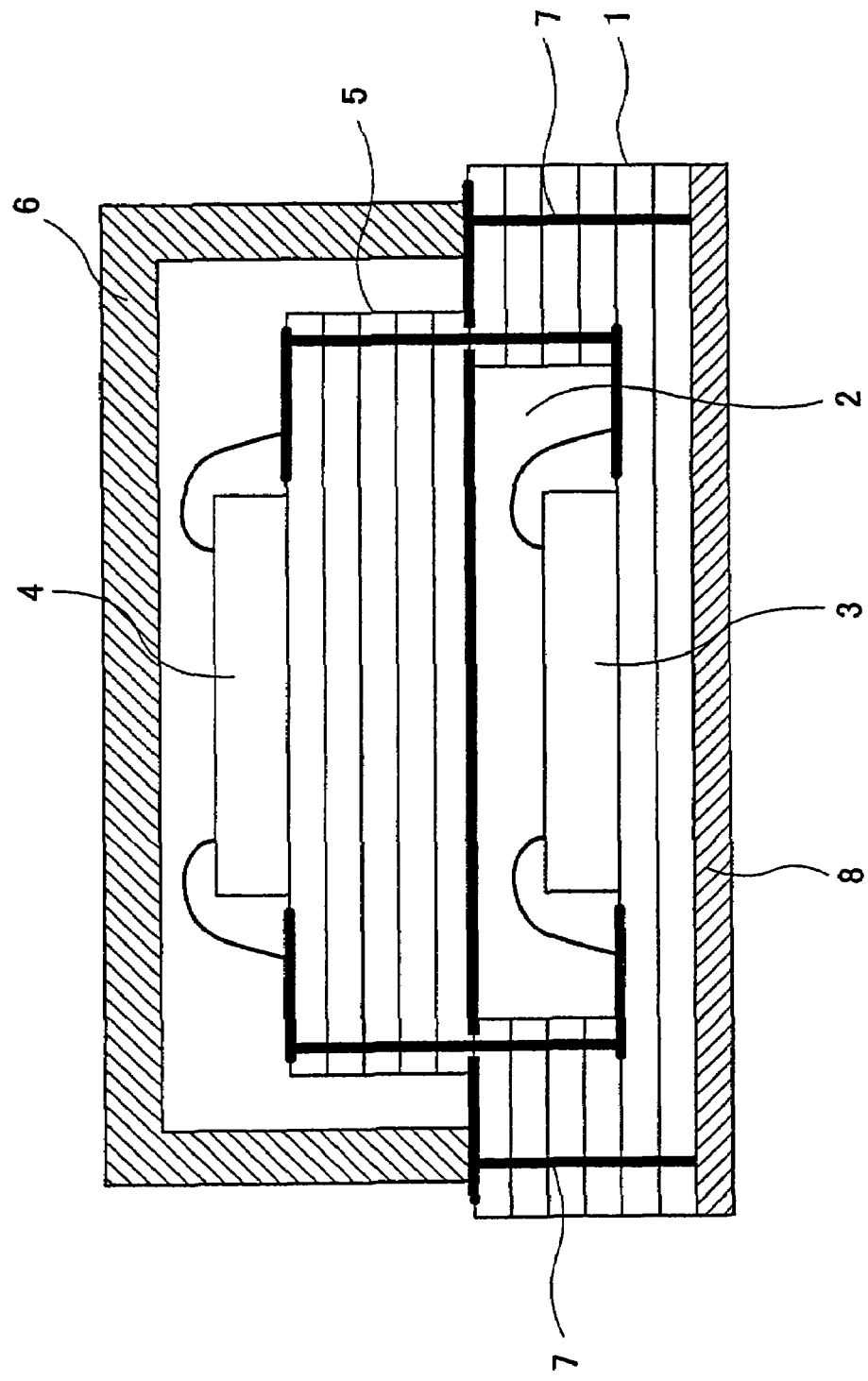
FIG. 9 shows a side elevational sectional view of a stacked-type semiconductor device in the related art.

FIG. 8 shows a side elevational sectional view of a stacked-type semiconductor device in a fifth embodiment of the present invention.

In the fifth embodiment, a semiconductor device element 34 and a chip component 35 such as a capacitor are mounted on the top side of a wiring substrate 33. Inside of the wiring substrate 33, a ground wiring layer 11 is embedded, and the ground wiring layer 11 is connected with connecting pads 13 for connecting with conductor supporting members 31 and connecting pads 15 for connecting with ground terminals 14 as shown.

Further, many connecting pads 20 are disposed in the periphery on the top side of the wiring substrate 33 for the purpose of electrically connecting the wiring substrate 33 and a wiring substrate 36 together through solder balls 19.

On the top side of the wiring substrate 36, a semiconductor device element 10 is mounted, connecting pads 38 are formed for connecting with conductor supporting members 37, and, in the periphery, many connecting pads 40 are disposed for electrically connecting the wiring substrate 36 and a wiring substrate 18 together by means of solder balls 39. On the bottom side of the wiring substrate 36, a ground wiring layer 41 is formed, and, in the periphery thereof, many connecting pads 27 are disposed for electrically connecting the wiring substrate 33 and the wiring substrate 36 together by means of the solder balls 19. The connecting pads 38 and the ground wiring layer 41 for connecting with conductor supporting members 37 are connected together by means of conductor members provided inside of the wiring substrate 36.

A configuration of a wiring substrate 18 with semiconductor device elements mounted thereon, further stacked on the top of the wiring substrate 36, is the same as the configuration of the wiring substrate 18 in the above-described fourth embodiment.

The fifth embodiment is an example of a stacked-type semiconductor device in which the three wiring substrates 33, 36 and 18 are connected in three stages by means of the solder balls 31 and 37 acting as the conductor supporting members as well as the solder balls 19 and 39 for electrically connecting these wiring substrates together. In this fifth embodiment, the top side, the bottom side and the lateral sides of each of the semiconductor device element 34 and the chip component 35 as well as the semiconductor device element 10 are enclosed by the conductors (the solder balls 31 and 37 acting as the conductor supporting members and the ground wiring layers 11, 41 and 26) having the ground potential, respectively. Thereby, unnecessary radiation generated from these semiconductor devices is effectively blocked, and thus, adverse influence thereof on other devices can be effectively reduced. It is not necessary to limit an embodiment of the present invention to such a configuration in which the wiring substrates are stacked in three stages, but it is also possible to further increase the number of stages in which wiring substrates are stacked. According to the fifth embodiment, even in a case where a plurality of radio frequency circuit device elements are mounted in the semiconductor device, it is possible to easily apply the present invention merely by increasing the number of stages in which wiring substrates are stacked accordingly.

Further, the present invention is not limited to the above-described embodiments, and variations and modifications may be made without departing from the basic concept of the present invention claimed below.

The present application is based on Japanese priority application No. 2003-180200, filed on Jun. 24, 2003, the entire contents of which are hereby incorporated by reference.

What is claimed is:

1. A stacked-type semiconductor device comprising:
   a first wiring substrate on which a semiconductor device element is mounted;
   a second wiring substrate stacked on said first wiring substrate through a plurality of electrode terminals electrically connecting with said first wiring substrate; and
   a conductor supporting frame disposed continuously around said semiconductor device element, also inside of the plurality of electrode terminals, and connected with grounding wiring layers provided in said first and second wiring substrates.

2. The stacked-type semiconductor device claimed in claim 1, wherein:
   the grounding wiring layer of at least one embedded in said at least one of said first and second substrates.

3. The stacked-type semiconductor device as claimed in claim 1, wherein:
   said semiconductor device element mounted on said first wiring substrate is mounted thereon in a flip-chip manner.

4. The stacked-type semiconductor device as claimed in claim 1, wherein:
   heat-conductive material is filled between the top side of said semiconductor device element mounted on said first wiring substrate and the grounding wiring layer provided on said second wiring substrate.

5. A stacked-type semiconductor device comprising:
   a first wiring substrate on which a semiconductor device element is mounted;
   a second wiring substrate stacked on said first wiring substrate through a plurality of electrode terminals electrically connecting with said first wiring substrate; and
   a plurality of conductor supporting members disposed in such a manner as to surround said semiconductor device element, disposed inside of the plurality of electrode terminals, and
   said plurality of conductor supporting members being connected with grounding wiring layers provided in said first and second wiring substrates.

6. The stacked-type semiconductor device as claimed in claim 5, wherein:
   said conductor supporting member comprises a plurality of solder balls.

7. A stacked-type semiconductor device comprising:
   a first wiring substrate on which a semiconductor device element is mounted;
   a second wiring substrate stacked on said first wiring substrate through a plurality of electrode terminals electrically connecting with said first wiring substrate; and
   a plurality of conductor supporting members disposed in such a manner as to surround said semiconductor device element, disposed inside of the plurality of electrode terminals, and
   said plurality of conductor supporting members being connected with grounding wiring layers in a form of a mesh pattern provided in said first and second wiring substrates.

* * * * *